United States Patent
Nakahashi

(10) Patent No.: US 11,115,000 B2
(45) Date of Patent: Sep. 7, 2021

(54) EXTRACTOR

(71) Applicant: Murata Manufacturing Co., Ltd., Nagaokakyo (JP)

(72) Inventor: Norihiko Nakahashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 5 days.

(21) Appl. No.: 16/541,207

(22) Filed: Aug. 15, 2019

(65) Prior Publication Data

US 2020/0091894 A1 Mar. 19, 2020

(30) Foreign Application Priority Data

Sep. 19, 2018 (JP) .............................. JP2018-174883

(51) Int. Cl.
*H03H 9/64* (2006.01)
*H03H 9/70* (2006.01)
*H03H 9/72* (2006.01)

(52) U.S. Cl.
CPC .......... *H03H 9/6433* (2013.01); *H03H 9/703* (2013.01); *H03H 9/725* (2013.01)

(58) Field of Classification Search
CPC ....... H03H 9/6433; H03H 9/703; H03H 9/725
USPC ........................................................ 333/193
See application file for complete search history.

(56) References Cited

U.S. PATENT DOCUMENTS

2002/0180562 A1* 12/2002 Taniguchi ............ H03H 9/6433
333/193
2011/0187478 A1 8/2011 Link et al.
2013/0147678 A1 6/2013 Taniguchi
2014/0010122 A1 1/2014 Krems et al.
2016/0380615 A1 12/2016 Endo
2017/0294896 A1 10/2017 Nosaka
2019/0044548 A1* 2/2019 Freisleben ........... H04B 1/0057
(Continued)

FOREIGN PATENT DOCUMENTS

| JP | 2001-024463 A | 1/2001 |
| JP | 2012-501564 A | 1/2012 |
| JP | 2012-175159 A | 9/2012 |

(Continued)

OTHER PUBLICATIONS

Official Communication issued in corresponding Korean Patent Application No. 10-2019-0099339, dated Nov. 16, 2020.

*Primary Examiner* — Hafizur Rahman
(74) *Attorney, Agent, or Firm* — Keating & Bennett, LLP

(57) ABSTRACT

An extractor includes a band elimination filter that is connected between a common terminal and a first input-output terminal and that has a stop band equal or substantially equal to a first frequency band, and a band pass filter that is connected between the common terminal and a second input-output terminal and that has a pass band equal or substantially equal to a second frequency band that overlaps the first frequency band. The band pass filter includes, series arm resonators, three or more parallel arm resonators, and three or more inductors that are connected between the ground and the parallel arm resonators. The L value of a first inductor that is connected and nearest to the common terminal is smaller than the L value of a third inductor, and the L value of a second inductor that is connected and second-nearest to the common terminal is smaller than the L value of the third inductor.

20 Claims, 10 Drawing Sheets

(56) References Cited

U.S. PATENT DOCUMENTS

2019/0199325 A1   6/2019   Yasuda

FOREIGN PATENT DOCUMENTS

| JP | 2014-501467 A | 1/2014 |
| JP | 2017-011635 A | 1/2017 |
| WO | 2012/020595 A1 | 2/2012 |
| WO | 2016/117676 A1 | 7/2016 |
| WO | 2018/047862 A1 | 3/2018 |

\* cited by examiner

EXTRACTOR

CROSS REFERENCE TO RELATED APPLICATIONS

This application claims the benefit of priority to Japanese Patent Application No. 2018-174883 filed Sep. 19, 2018. The entire contents of this application are hereby incorporated herein by reference.

BACKGROUND OF THE INVENTION

1. Field of the Invention

The present invention relates to an extractor that includes a band pass filter and a band elimination filter.

2. Description of the Related Art

There is a requirement to handle communication in different radio frequency bands, such as 5G (5th Generation) communication including cellular communication, Wi-Fi (registered trademark) communication, and GPS (registered trademark) communication, with different wireless systems by a single antenna. Accordingly, an extractor is disposed right below an antenna of a wireless terminal device, and the extractor includes a combination of a band pass filter (BPF) that allows a high-frequency signal having a single radio carrier frequency to pass therethrough and a band elimination filter (BEF) that does not allow the high-frequency signal having the radio carrier frequency to pass therethrough and that allows a high-frequency signal having a different radio carrier frequency to pass therethrough.

International Publication No. 2012/020595 discloses a high-frequency module in which a band elimination filter and a band pass filter are connected to a second antenna.

In an extractor that includes a combination of a band pass filter and a band elimination filter, however, a harmonic wave of a high-frequency signal that passes through the band pass filter degrades isolation between the band pass filter and the band elimination filter in a frequency band higher than a stop band of the band elimination filter. Consequently, there is a problem in that the insertion loss of the band elimination filter in the frequency band higher than the stop band increases.

SUMMARY OF THE INVENTION

Preferred embodiments of the present invention provide extractors that each enable the insertion loss of a band elimination filter to be reduced.

According to a preferred embodiment of the present invention, an extractor includes a common terminal, a first input-output terminal, a second input-output terminal, a band elimination filter that is connected between the common terminal and the first input-output terminal and that has a stop band equal or substantially equal to a first frequency band, and a first band pass filter that is connected between the common terminal and the second input-output terminal and that has a pass band equal or substantially equal to a second frequency band that overlaps at least a portion of the first frequency band. The first band pass filter includes, series arm resonators that include an acoustic wave resonator and that are disposed on a series arm that connects the common terminal and the second input-output terminal to each other, three or more parallel arm resonators that include an acoustic wave resonator and that are disposed on parallel arms that connect a ground and different nodes on the series arm to each other, and three or more inductors that are connected between the ground and at least one of the three or more parallel arm resonators. An inductance value of a first inductor that is connected and nearest to the common terminal among the three or more inductors is smaller than an inductance value of a third inductor that has a smallest inductance value among inductors that are connected and third-nearest or more distant to the common terminal in the three or more inductors, and an inductance value of a second inductor that is connected and second-nearest to the common terminal among the three or more inductors is smaller than the inductance value of the third inductor.

According to preferred embodiments of the present invention, extractors that each include the band elimination filter the insertion loss of which are reduced is able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
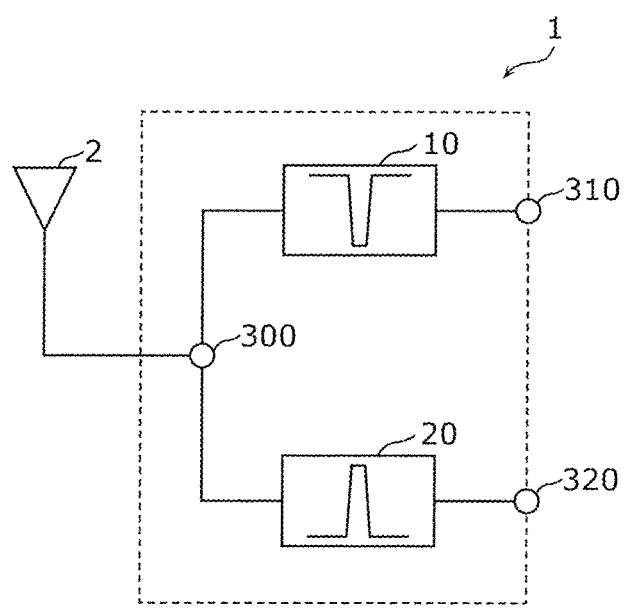
FIG. 1 is a block diagram of an extractor and an antenna according to a preferred embodiment of the present invention.

Preferred embodiments of the present invention will hereinafter be described in detail with reference to an example, modifications, and the drawings. The examples of preferred embodiments and modifications described below are comprehensive or specific examples. In the following examples and modifications, numerical values, shapes, materials, components, and the arrangement and connection structure of the components are described by way of example and do not limit the present invention. Among the components according to the examples and modifications below, components that are not recited in the independent claim are described as optional components. The size of each component illustrated in the drawings or the ratio of the size is not necessarily illustrated strictly.

FIG. 1 is a block diagram of an extractor 1 and an antenna 2 according to a preferred embodiment of the present invention. As illustrated in FIG. 1, the extractor 1 preferably includes a common terminal 300, input-output terminals 310 and 320, a band elimination filter 10, and a band pass filter 20.

The band elimination filter (BEF) 10 is connected between the common terminal 300 and the input-output terminal 310 (first input-output terminal) and has a stop band equal or substantially equal to a first frequency band.

The band pass filter (BPF) 20 is a first band pass filter that is connected between the common terminal 300 and the input-output terminal 320 (second input-output terminal) and has a pass band equal or substantially equal to a second frequency band that overlaps at least a portion of the first frequency band.

The band elimination filter 10 and the band pass filter 20 are connected to the antenna 2 with the common terminal 300 interposed therebetween.

With the above structure, the extractor 1 transmits high-quality high-frequency signals preferably by, for example, 5G (5th Generation) including a cellular system, Wi-Fi (registered trademark), and GPS (registered trademark) to the antenna 2. The high-frequency signals that are received from the antenna 2 are transmitted as high-quality signals to a RF-signal-processing circuit (not illustrated) via a filter, an amplifier circuit, and other components. The first frequency band and the second frequency band are preferably used for, for example, Wi-Fi (registered trademark) communication and GPS (registered trademark) communication. Frequency bands except for the first frequency band and the second frequency band include a frequency band that is used for, for example, cellular system communication.

Figure 2:
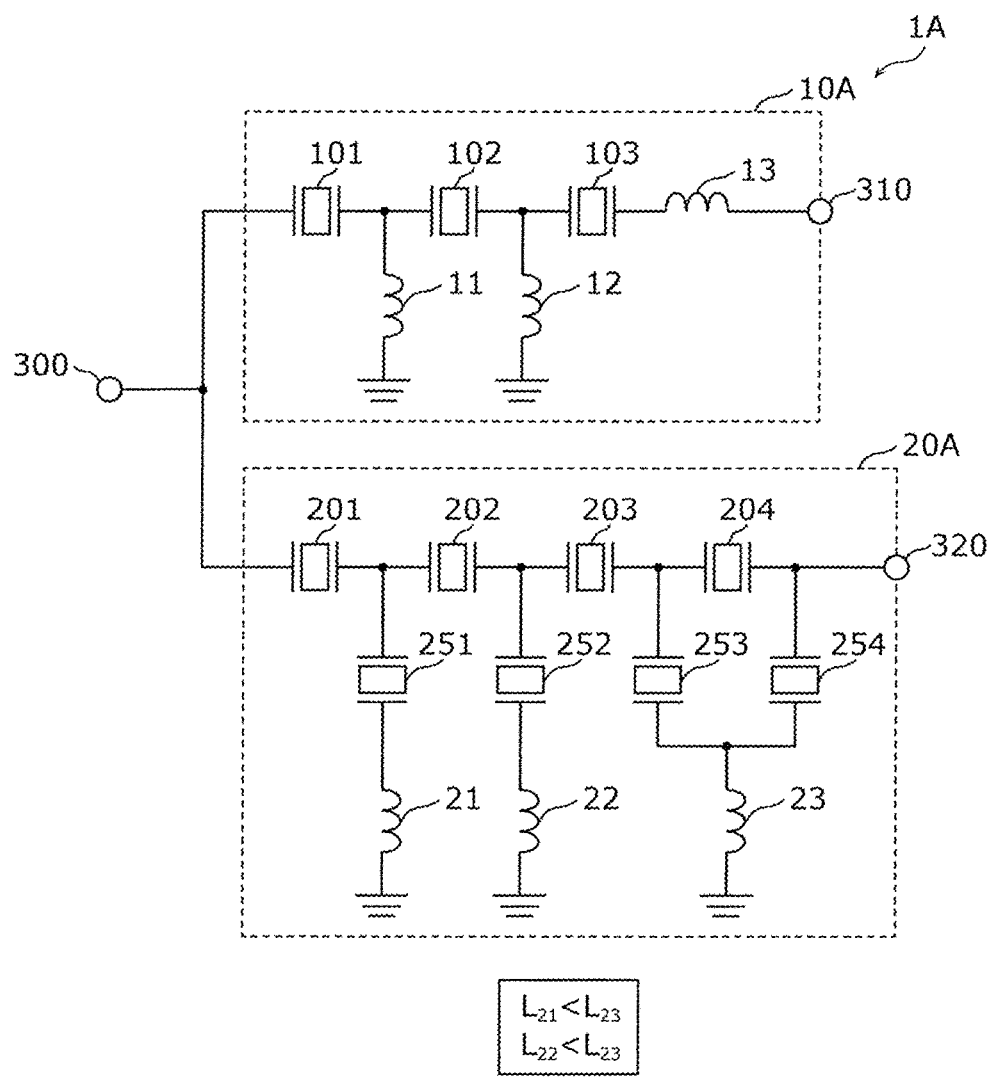
FIG. 2 is a circuit diagram of an extractor according to an example of a preferred embodiment according to the present invention.

FIG. 2 is a circuit diagram of an extractor 1A according to an example of a preferred embodiment of the present invention. As illustrated in FIG. 2, the extractor 1A preferably includes the common terminal 300, the input-output terminals 310 and 320, a band elimination filter 10A, and a band pass filter 20A. The extractor 1A according to the example embodiment is a specific example of the extractor 1 according to a preferred embodiment of the present invention.

The band elimination filter 10A is a specific example of the band elimination filter 10 according to a preferred embodiment of the present invention and preferably includes series arm resonators 101, 102, and 103 and inductors 11, 12, and 13.

The series arm resonators 101 to 103 are disposed on a series arm that connects the common terminal 300 and the input-output terminal 310 to each other and includes respective acoustic wave resonators.

The inductor 13 is disposed in series between the series arm resonator 103 and the input-output terminal 310.

The inductor 11 is disposed on a parallel arm that connects the ground to a node on the series arm that connects the series arm resonators 101 and 102 to each other. The inductor 12 is disposed on a parallel arm that connects the ground to a node on the series arm that connects the series arm resonators 102 and 103 to each other.

The band elimination filter 10A with the above structure has a highly steep stop band and a low-loss pass band because the series arm resonators 101 to 103 that include the respective acoustic wave resonators are disposed on a series arm path, and have a wide pass band because the inductors 11 and 12 are disposed on parallel arm paths.

The band pass filter 20A is a specific example of the band pass filter 20 according to a preferred embodiment and preferably includes series arm resonators 201, 202, 203, and 204, parallel arm resonators 251, 252, 253, and 254, and inductors 21, 22, and 23.

The series arm resonators 201 to 204 are disposed on a series arm that connects the common terminal 300 and the input-output terminal 320 to each other and includes respective acoustic wave resonators.

The parallel arm resonators 251 to 254 are disposed on parallel arms that connect the ground and different nodes on the series arm to each other and include respective acoustic wave resonators.

The inductor 21 is disposed on a parallel arm that connects the ground and the parallel arm resonator 251 to each other. The inductor 22 is disposed on a parallel arm that connects the ground and the parallel arm resonator 252 to each other. The inductor 23 is disposed on a parallel arm that connects the ground and a connection node of the parallel arm resonators 253 and 254 to each other.

The above structure of the band pass filter 20A is able to provide a ladder acoustic wave filter that has a low-loss pass band and steepness of a transition band from the pass band to an attenuation band because the series arm resonators 201 to 204 that include the respective acoustic wave resonators are disposed on a series arm path, and the parallel arm resonators 251 to 254 that include the respective acoustic wave resonators are disposed on parallel arm paths. In addition, the attenuation and frequency of an attenuation pole in the attenuation band is able to be adjusted and optimized because the inductors 21 to 23 are disposed on the parallel arm paths.

The number of the series arm resonators of the band pass filter 20A is not limited to four and may be two or more, for example. The number of the parallel arm resonators is not limited to four and may be three or more, for example. The number of the inductors that are disposed between the ground and the parallel arm resonators is not limited to three and may be three or more, for example.

Each of the acoustic wave resonators that are included in the band elimination filter 10A and the band pass filter 20A may preferably be a surface acoustic wave resonator or an acoustic wave resonator that uses a BAW (Bulk Acoustic Wave). A surface acoustic wave includes, for example, a surface wave, a Love wave, a Leaky wave, a Rayleigh wave, a boundary wave, a leaky SAW, a pseudo SAW, and a Lamb wave.

This enables the band elimination filter 10A and the band pass filter 20A to have a lower loss and higher steepness.

The band elimination filter 10A does not necessarily include the acoustic wave resonators and may be a surface acoustic wave filter, an acoustic wave filter that uses a BAW, a LC resonance filter, a dielectric filter, or a LC filter, for example. The structure of the filter is freely determined.

The inductance value $L_{21}$ of the inductor 21 (first inductor) that is connected and nearest to the common terminal 300 among the three inductors 21 to 23 of the band pass filter 20A is preferably smaller than the inductance value $L_{23}$ of the inductor (third inductor) that are connected and third-nearest to the common terminal 300 among the inductors 21 to 23. The inductance value $L_{22}$ of inductor 22 (second inductor) that is connected and second-nearest to the common terminal 300 among the three inductors 21 to 23 is preferably smaller than the inductance value $L_{23}$ of the inductor 23 (third inductor) that is connected and third-nearest to the common terminal 300 among the inductors 21 to 23.

When the band pass filter 20A includes four or more inductors that are disposed between the ground and the parallel arm resonators, the inductance value of the first inductor that is connected and nearest to the common terminal 300 among the four or more inductors is preferably smaller than the inductance value of the third inductor that has the smallest inductance value among inductors that are connected and third-nearest or more distant to the common terminal 300 in the four or more inductors. The inductance value of the second inductor that is connected and second-nearest to the common terminal 300 among the four or more inductors is preferably smaller than the inductance value of the above third inductor.

In an existing extractor in which a band elimination filter and a band pass filter are connected to a common terminal, a harmonic wave that is generated due to nonlinearity of the band pass filter degrades isolation between the band elimination filter and the band pass filter in a frequency band higher than the stop band of the band elimination filter. Accordingly, the insertion loss of the band elimination filter in the frequency band higher than the stop band increases.

With the above structure of the extractor 1A according to the example, however, the inductance values of the inductors 21 and 22 that are nearest and second-nearest to the common terminal 300 among the three inductors 21 to 23 that are disposed on the different parallel arm paths of the band pass filter 20A are preferably smaller than the inductance value of the other inductor 23. Accordingly, the impedance of the band pass filter 20A itself in a frequency band higher than the stop band of the band elimination filter 10A when viewed from the common terminal 300 is preferably closer to that in an open state (high impedance) than the impedance of the existing band pass filter itself in the frequency band higher than the stop band. In the existing band pass filter, the inductance values of inductors that are nearest and second-nearest to the common terminal 300 are preferably not smaller than the inductance value of the other inductor.

In other words, the reflection coefficient of the band pass filter 20A according to the example in the frequency band higher than the stop band is larger than the reflection coefficient of the existing band pass filter itself in the above band. Accordingly, the insertion loss of the band elimination filter 10A in the frequency band higher than the stop band is able to be reduced. Accordingly, the extractor 1A that includes the band elimination filter 10A the insertion loss of which is reduced is able to be provided.

The following detailed description contains a principle upon which the insertion loss of the band elimination filter 10A of the extractor 1A according to the example is able to be reduced more than that in the existing extractor, and the effect thereof.

Figure 3A:
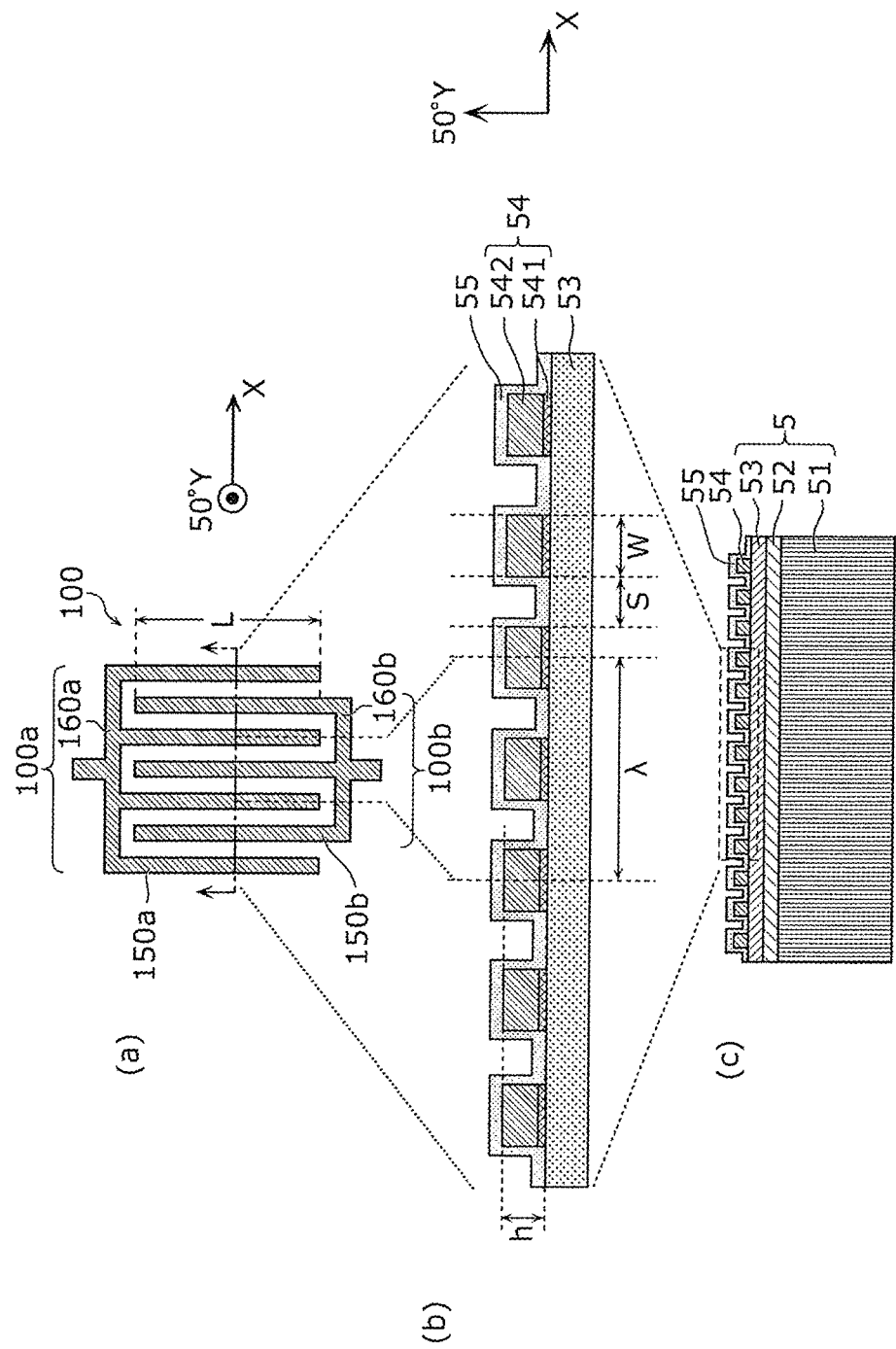
FIG. 3A schematically illustrates a plan view and a sectional view of an acoustic wave resonator according to the example of the preferred embodiment.

FIG. 3A schematically illustrates one of the acoustic wave resonators according to the example of a preferred embodiment of the present invention, in which a plan view is illustrated at (a), a sectional view taken along a one-dot chain line illustrated in (a) is illustrated at (b) and (c). An acoustic wave resonator 100 illustrated by way of example in FIG. 3A has the same structure as the basic structure of the series arm resonators 201 to 204 and the parallel arm resonators 251 to 254 that are included in the band pass filter 20A and the series arm resonators 101 to 103 that are included in the band elimination filter 10A. In FIG. 3A, the acoustic wave resonator 100 is illustrated to describe a typical structure of each acoustic wave resonator, and the number and length of electrode fingers that are included in an electrode are not limited thereto.

The acoustic wave resonator 100 preferably includes a piezoelectric substrate 5 and comb electrodes 100a and 100b.

As illustrated at (a) in FIG. 3A, a pair of the comb electrodes 100a and 100b that face each other are provided on the substrate 5. The comb electrode 100a includes electrode fingers 150a that are parallel or substantially parallel to each other and a busbar electrode 160a that connects the electrode fingers 150a to each other. The comb electrode 100b includes electrode fingers 150b that are parallel or substantially parallel to each other and a busbar electrode 160b that connects the electrode fingers 150b to each other. The electrode fingers 150a and 150b extend in the direction perpendicular or substantially perpendicular to the direction (X-axis direction) in which an acoustic wave is transmitted.

As illustrated at (b) in FIG. 3A, an interdigital transducer electrode 54 that includes the electrode fingers 150a and 150b and the busbar electrodes 160a and 160b has a multilayer structure of a close-contact layer 541 and a main electrode layer 542.

The close-contact layer 541 improves adhesion between the substrate 5 and the main electrode layer 542, and an example of the material thereof is Ti. The film thickness of the close-contact layer 541 is preferably, for example, about 12 nm.

An example of the material of the main electrode layer 542 is Al containing about 1% of Cu, for example. The film thickness of the main electrode layer 542 is preferably, for example, about 162 nm.

A protective layer 55 covers the comb electrodes 100a and 100b. The protective layer 55 protects the main electrode layer 542 from external environment, adjusts frequency and temperature characteristics, and increases humidity resistance, and is preferably, for example, a dielectric film whose main component is silicon dioxide. The thickness of the protective layer 55 is preferably, for example, about 25 nm.

The materials of the close-contact layer 541, the main electrode layer 542, and the protective layer 55 are not limited to the above materials. The interdigital transducer electrode 54 may not have the above multilayer structure. The interdigital transducer electrode 54 may preferably be made of, for example, a metal such as Ti, Al, Cu, Pt, Au, Ag, or Pd, or an alloy thereof. The interdigital transducer electrode 54 may preferably be made of multilayer bodies of the above metal or alloy. The protective layer 55 may not be provided.

The multilayer structure of the substrate 5 will now be described.

As illustrated in FIG. 3A at (c), the substrate 5 includes a high acoustic velocity support substrate 51, a low acoustic velocity film 52, and a piezoelectric film 53. The high acoustic velocity support substrate 51, the low acoustic velocity film 52, and the piezoelectric film 53 are stacked in this order.

The piezoelectric film 53 is preferably made of, for example, a 50° Y-cut X-transmission $LiTaO_3$ piezoelectric single crystal or piezoelectric ceramics (lithium tantalate single crystal or ceramics that is cut along a plane whose normal coincides with an axis rotated approximately 50° about the X-axis from the Y-axis, and a surface acoustic wave is transmitted in the X-axis direction through the single crystal or ceramics). The thickness of the piezoelectric film 53 is preferably, for example, about 600 nm. Cut-angles and the material of the piezoelectric single crystal that is used as the piezoelectric film 53 are appropriately selected in accordance with the required specification of each filter.

The high acoustic velocity support substrate 51 supports the low acoustic velocity film 52, the piezoelectric film 53, and the interdigital transducer electrode 54. A bulk wave is transmitted through the high acoustic velocity support substrate 51 at an acoustic velocity higher than an acoustic velocity at which an elastic wave such as a surface wave or a boundary wave is transmitted through the piezoelectric film 53. The high acoustic velocity support substrate 51 confines a surface acoustic wave in a portion at which the piezoelectric film 53 and the low acoustic velocity film 52 are stacked and prevents the surface acoustic wave from leaking downward from the high acoustic velocity support substrate 51. An example of the high acoustic velocity support substrate 51 is a silicon substrate, and the thickness thereof is preferably, for example, about 200 μm.

A bulk wave is transmitted through the low acoustic velocity film 52 at an acoustic velocity lower than an acoustic velocity at which a bulk wave is transmitted through the piezoelectric film 53, and the low acoustic velocity film 52 is disposed between the piezoelectric film 53 and the high acoustic velocity support substrate 51. Because of this structure and a property of an elastic wave whose energy concentrates on a substantially low acoustic velocity medium, the energy of a surface acoustic wave is inhibited from leaking to the outside of the interdigital transducer electrode. An example of a main component of the low acoustic velocity film 52 is silicon dioxide, and the thickness thereof is preferably, for example, about 670 nm.

With the above multilayer structure of the substrate 5, a Q factor at a resonant frequency and an anti-resonant frequency is able to be greatly increased more than with an existing structure including a piezoelectric substrate in a single layer. That is, a surface acoustic wave resonator having a high Q factor is able to be obtained, and the use of the surface acoustic wave resonator enables a filter having a low insertion loss to be obtained.

The high acoustic velocity support substrate 51 may have a multilayer structure including a support substrate and a high acoustic velocity film through which a bulk wave is transmitted at an acoustic velocity higher than an acoustic velocity at which an elastic wave such as a surface wave or a boundary wave is transmitted through the piezoelectric film 53. In this case, examples of the material of the support substrate include piezoelectric materials such as lithium tantalate, lithium niobate, and crystal, ceramics such as sapphire, alumina, magnesia, silicon nitride, aluminum nitride, silicon carbide, zirconia, cordierite, mullite, steatite, and forsterite, a dielectric such as glass, a semiconductor such as silicon and gallium nitride, and a resin. Examples of the material of the high acoustic velocity film include aluminum nitride, aluminum oxide, silicon carbide, silicon nitride, silicon oxynitride, DLC, diamond, a medium whose main component is one of these materials, and a medium whose main component is a mixture of these materials.

Figure 3B:
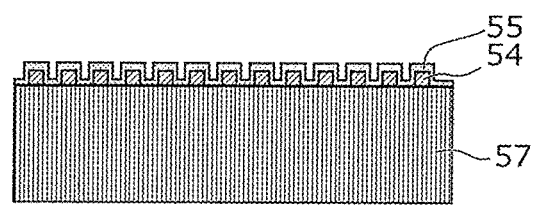
FIG. 3B schematically illustrates a sectional view of a modification to the acoustic wave resonator of a preferred embodiment of the present invention.

FIG. 3B schematically illustrates a sectional view of a modification to the acoustic wave resonator according to a preferred embodiment of the present invention. The acoustic wave resonator 100 illustrated by way of example in FIG. 3A includes the interdigital transducer electrode 54 that is provided on the substrate 5 including the piezoelectric film 53. As illustrated in FIG. 3B, the substrate on which the interdigital transducer electrode 54 is provided may be a single-crystal piezoelectric substrate 57 defined as a single piezoelectric layer. The single-crystal piezoelectric substrate 57 is preferably made of, for example, a $LiNbO_3$ piezoelectric single crystal. The acoustic wave resonator 100 according to the present modification includes the single-crystal piezoelectric substrate 57 made of $LiNbO_3$, the interdigital transducer electrode 54, and the protective layer 55 that is provided on the single-crystal piezoelectric substrate 57 and the interdigital transducer electrode 54.

The multilayer structure, the material, the Cut-Angles, and the thickness of the piezoelectric film 53 and the single-crystal piezoelectric substrate 57 may be appropriately changed in accordance with the required bandpass characteristic of an elastic wave filter device. Even when the acoustic wave resonator 100 is made of a $LiTaO_3$ piezoelectric substrate having Cut-Angles different from the above Cut-Angles, the same or substantially the same advantageous effects as in the case of using the acoustic wave resonator 100 including the piezoelectric film 53 described above are able to be achieved.

The substrate on which the interdigital transducer electrode 54 is provided may include a support substrate, an energy-confining layer, and a piezoelectric film that are stacked in this order. The interdigital transducer electrode 54 is provided on the piezoelectric film. For example, $LiTaO_3$ piezoelectric single crystal or piezoelectric ceramics is used for the piezoelectric film. The support substrate supports the piezoelectric film, the energy-confining layer, and the interdigital transducer electrode 54.

The energy-confining layer is preferably defined as a single layer or plural layers, and the velocity of a bulk acoustic wave that is transmitted through at least one of the layers is higher than the velocity of an acoustic wave that is transmitted near the piezoelectric film. For example, a multilayer structure of a low-acoustic-velocity layer and a high-acoustic-velocity layer is also acceptable. The low-acoustic-velocity layer is a film where the acoustic velocity of a bulk wave in the low-acoustic-velocity layer is lower than the acoustic velocity of a bulk wave that is transmitted through the piezoelectric film. The high-acoustic-velocity layer is a film where the acoustic velocity of a bulk wave in the high-acoustic-velocity layer is lower than the acoustic velocity of an acoustic wave that is transmitted through the piezoelectric film. The support substrate may be a high-acoustic-velocity layer.

The energy-confining layer may be an acoustic-impedance layer in which low-acoustic-impedance layers, the acoustic impedance of which is relatively low and high-acoustic-impedance layers, the acoustic impedance is relatively high are alternately stacked.

Examples of electrode parameters of the interdigital transducer electrode that is included in the acoustic wave resonator 100 will now be described.

The wave length of the acoustic wave resonator is defined by a wave length λ, which is the repetition period of the electrode fingers 150a or 150b that are included in the interdigital transducer electrode 54 illustrated at (b) in FIG. 3A. An electrode pitch, which is a half of the wave length λ, is defined as (W+S) where W is the line width of the electrode fingers 150a and 150b that are included in the comb electrodes 100a and 100b, and S is a space width between the electrode fingers 150a and the electrode fingers 150b that are adjacent to each other. The crossing width L of the pair of the comb electrodes 100a and 100b corresponds to the length of the electrode fingers that overlap when the electrode fingers 150a and the electrode fingers 150b are viewed in the direction (X-axis direction) in which an acoustic wave is transmitted as illustrated at (a) in FIG. 3A. The electrode duty of the acoustic wave resonator, which is a line width occupancy ratio of the electrode fingers 150a and 150b and a ratio of the line width to the sum of the line width and the space width of the electrode fingers 150a and 150b, is defined as W/(W+S). The number of pairs of interdigital transducer electrode fingers means the average of the number of the electrode fingers 150a and the number of the electrode fingers 150b.

The height of the comb electrodes 100a and 100b is represented by h. In the following description, parameters related to the shape of the interdigital transducer electrode of the acoustic wave resonator, such as the wave length $\lambda$, the crossing width L, the electrode duty, the number of pairs of interdigital transducer electrode fingers, and the height h of the interdigital transducer electrode 54, are referred to as electrode parameters.

Figure 4:
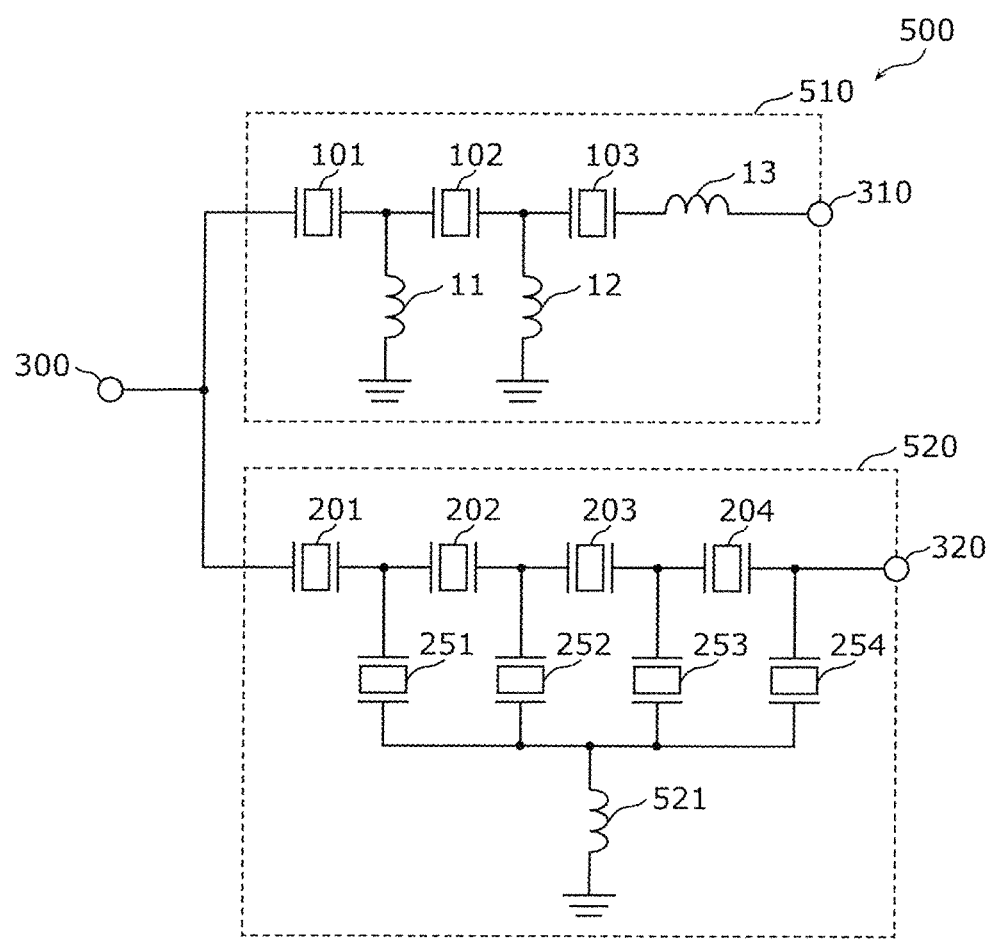
FIG. 4 is a circuit diagram of an extractor according to a comparative example.

FIG. 4 is a circuit diagram of an extractor 500 according to a comparative example. As illustrated in FIG. 4, the extractor 500 includes the common terminal 300, the input-output terminals 310 and 320, a band elimination filter 510, and a band pass filter 520. The extractor 500 according to the comparative example differs from the extractor 1A according to the example in the structure of the band pass filter 520. In the following description of the extractor 500 according to the comparative example, a description of the band elimination filter 510 that has the same or substantially the same structure as the extractor 1A according to the example is omitted, and the band pass filter 520 that has a different structure will be mainly described.

The band pass filter 520 includes the series arm resonators 201, 202, 203, and 204, the parallel arm resonators 251, 252, 253, and 254, and an inductor 521.

The series arm resonators 201 to 204 have the same or substantially the same structure as the series arm resonators 201 to 204 of the band pass filter 20A according to the example. The parallel arm resonators 251 to 254 have the same or substantially the same structure as the parallel arm resonators 251 to 254 of the band pass filter 20A according to the example.

The inductor 521 is disposed on a parallel arm that connects the ground and a connection node of the parallel arm resonators 251 to 254.

The circuit structure of the extractor 500 according to the comparative example has a structure in which the inductance values of inductors that are nearest and second-nearest to the common terminal are not smaller than the inductance value of the other inductor as described above. Similarly, in the extractor 500 according to the comparative example, there is the single inductor that is disposed between the ground and the parallel arm resonators, and this structure corresponds to the structure in which the inductance values of the inductors that are nearest and second-nearest to the common terminal are not smaller than the inductance value of the other inductor.

Table 1 illustrates the inductance value of each inductor and the electrode parameters of the extractors according to the example and the comparative example. Among the parameters of the extractor 500 according to the comparative example, the parameters of the series arm resonators 101 to 103 and 201 to 204, the parallel arm resonators 251 to 254, and the inductors 11 to 13 are the same as the parameters of the extractor 1A according to the example and are omitted in Table 1.

TABLE 1

| BAND ELIMINATION FILTER 10A (EXAMPLE) | SERIES ARM RESONATOR 101 | SERIES ARM RESONATOR 102 | SERIES ARM RESONATOR 103 |
|---|---|---|---|
| NUMBER OF PAIRS OF INTERDIGITAL TRANSDUCER ELECTRODE FINGERS(PAIR) | 210 | 180 | 210 |
| CROSSING WIDTH (μm) | 70 | 30 | 42 |
| ELECTRODE DUTY | 0.60 | 0.60 | 0.60 |
| INTERDIGITAL TRANSDUCER WAVE LENGTH (μm) | 2.51 | 2.53 | 2.56 |

|  | INDUCTOR 11 | INDUCTOR 12 | INDUCTOR 13 |
|---|---|---|---|
| INDUCTANCE VALUE (nH) | 8.0 | 9.1 | 3.2 |

| BAND PASS FILTER 20A (EXAMPLE) | SERIES ARM RESONATOR 201 | SERIES ARM RESONATOR 202 | SERIES ARM RESONATOR 203 | SERIES ARM RESONATOR 204 |
|---|---|---|---|---|
| NUMBER OF PAIRS OF INTERDIGITAL TRANSDUCER ELECTRODE FINGERS(PAIR) | 59 | 196 | 95 | 117 |
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.43 | 2.43 | 2.42 | 2.45 |

|  | PARALLEL ARM RESONATOR 251 | PARALLEL ARM RESONATOR 252 | PARALLEL ARM RESONATOR 253 | PARALLEL ARM RESONATOR 254 |
|---|---|---|---|---|
| NUMBER OF PAIRS OF INTERDIGITAL TRANSDUCER ELECTRODE FINGERS(PAIR) | 50 | 152 | 128 | 112 |

TABLE 1-continued

| | | | | |
|---|---|---|---|---|
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.53 | 2.54 | 2.56 | 2.54 |

| | INDUCTOR 21 | INDUCTOR 22 | INDUCTOR 23 |
|---|---|---|---|
| INDUCTANCE VALUE (nH) | 0.1 | 0.1 | 2.8 |

| BAND PASS FILTER 520 (COMPARATIVE EXAMPLE) | INDUCTOR 521 |
|---|---|
| INDUCTANCE VALUE (nH) | 0.24 |

Figure 5A:
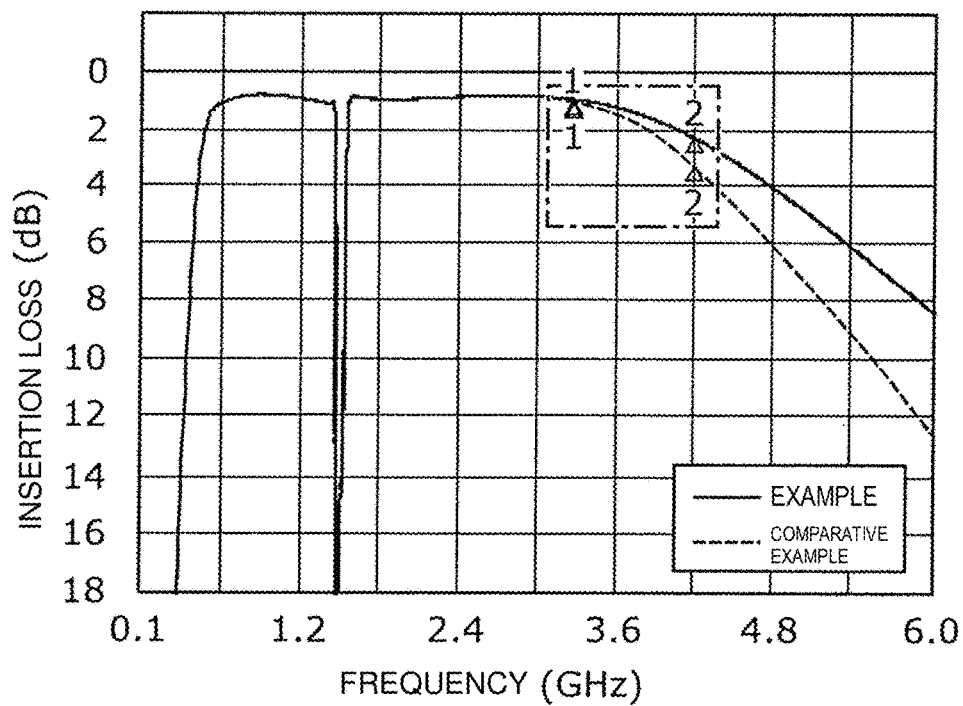
FIG. 5A is a graph illustrating comparison between transmission characteristics of band elimination filters according to the example of a preferred embodiment and the comparative example.
Figure 5B:
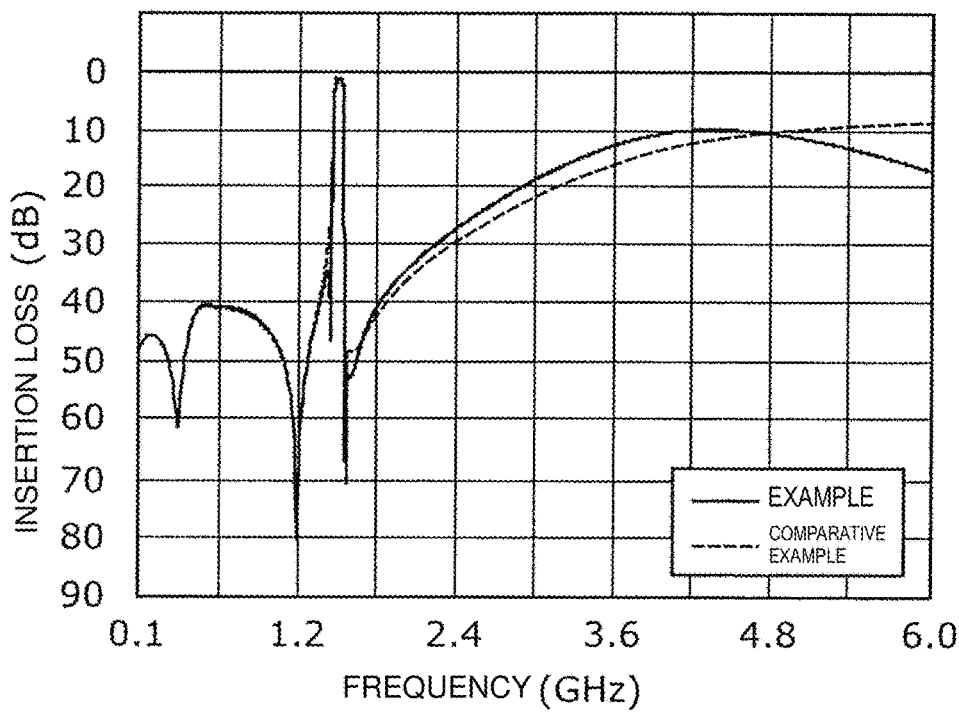
FIG. 5B is a graph illustrating comparison between transmission characteristics of band pass filters according to the example of a preferred embodiment and the comparative example.

FIG. 5A is a graph illustrating comparison between transmission characteristics of the band elimination filters according to the example and the comparative example. FIG. 5B is a graph illustrating comparison between transmission characteristics of the band pass filters according to the example and the comparative example.

As illustrated in FIG. 5B, the pass band of the band pass filter 20A is a GPS (registered trademark) band (center frequency of about 1575.42 MHz). The structure of the inductors that are disposed between the ground and the parallel arm resonators in the band pass filter 20A according to the example differs from that in the band pass filter 520 according to the comparative example. Accordingly, there is a slight difference between the transmission characteristics in the attenuation band, but the insertion losses in the pass band are substantially the same.

Regarding the transmission characteristics of the band elimination filters illustrated in FIG. 5A, however, the insertion loss of the band elimination filter 10A according to the example in a frequency band higher than about 3 GHz is lower than (improved more than) that of the band elimination filter 510 according to the comparative example. In particular, the insertion loss of the band elimination filter 10A according to the example is improved in a Bandn77 band (about 3.3 GHz to about 4.2 GHz) of 5GNR (New Radio).

In the extractor 500 according to the comparative example, a (second) harmonic wave of a high-frequency signal in a GPS (registered trademark) band that is generated due to the nonlinearity of the band pass filter 520 degrades isolation between the band elimination filter 510 and the band pass filter 520 in the Bandn77 band (about 3.3 GHz to about 4.2 GHz), which is a frequency band higher that the stop band of the band elimination filter 510. Accordingly, the insertion loss of the band elimination filter 510 in the Bandn77 band (about 3.3 GHz to about 4.2 GHz) increases.

Figure 6A:
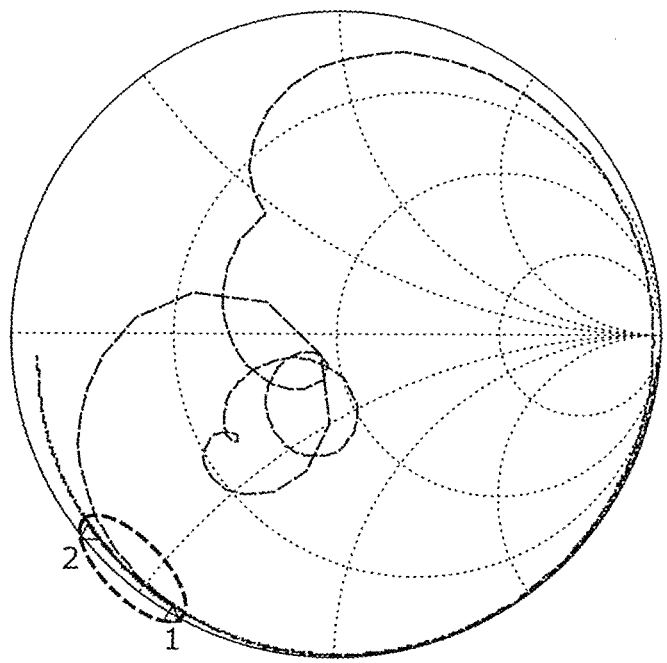
FIG. 6A illustrates a Smith chart illustrating impedance characteristics of the band pass filter according to the comparative example.

FIG. 6A illustrates a Smith chart illustrating impedance characteristics of the band pass filter 520 according to the comparative example. In FIG. 6A, the impedance characteristics of the band pass filter 520 itself when viewed from the common terminal 300 are illustrated. The GPS (registered trademark) band, which is the pass band, is located near the center (reference impedance) of the Smith chart. However, the Bandn77 band (about 3.3 GHz to about 4.2 GHz; marker 1 to marker 2 in FIG. 6A), which is the attenuation band higher than the pass band, is located near the outer circumference (high reactance area) of the Smith chart and in a low impedance area.

Figure 6B:
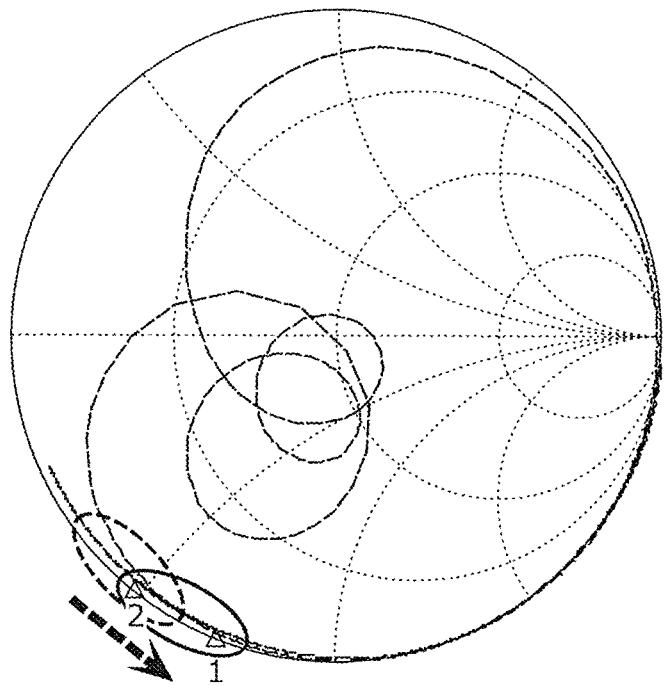
FIG. 6B illustrates a Smith chart illustrating impedance characteristics of the band pass filter according to the example of a preferred embodiment of the present invention.

FIG. 6B illustrates a Smith chart illustrating impedance characteristics of the band pass filter 20A according to the example. In FIG. 6B, the impedance characteristics of the band pass filter 20A itself when viewed from the common terminal 300 are illustrated. The GPS (registered trademark) band, which is the pass band, is located near the center (reference impedance) of the Smith chart. However, the Bandn77 band (about 3.3 GHz to about 4.2 GHz; marker 1 to marker 2 in FIG. 6B), which is the attenuation band higher than the pass band, is located near the outer circumference (high reactance area) of the Smith chart.

The impedance of the band pass filter 20A according to the example in the attenuation band (about 3.3 GHz to about 4.2 GHz) is closer to a high impedance than the impedance of the band pass filter 520 according to the comparative example in the attenuation band (about 3.3 GHz to about 4.2 GHz). That is, the reflection coefficient of the band pass filter 20A according to the example in the attenuation band (about 3.3 GHz to about 4.2 GHz) is larger than the reflection coefficient of the band pass filter 520 according to the comparative example in the attenuation band (about 3.3 GHz to about 4.2 GHz). Accordingly, the band elimination filter 10A according to the example is able to reduce the insertion loss in the Bandn77 band (about 3.3 GHz to about 4.2 GHz) more than the band elimination filter 510 according to the comparative example, because the band elimination filter 10A is connected to the band pass filter 20A at the common terminal 300.

This is attributed to the following reasons: (1) in the case where the inductors are connected in parallel to the band pass filter, the impedance of the band pass filter itself when viewed from the common terminal 300 moves counterclockwise along a circle of constant conductance of an admittance chart, and the distance of movement increases as the inductance value decreases, and (2) the impedance when viewed from the common terminal 300 is greatly affected by a circuit element that is connected and near to the common terminal 300.

In Table 1, the inductance values of the inductors 21 and 22 that are near the common terminal 300 of the band pass filter 20A according to the example are about 0.1 nH, but the inductance value of the other inductor 23 (that is third-nearest to the common terminal 300) is about 2.8 nH. There is the single inductor 521 that is connected to the parallel arm resonators of the band pass filter 520 according to the comparative example, and the inductance value thereof is about 0.24 nH.

In order to satisfy attenuation characteristics that are required for the band pass filter, it is necessary for the sum of the inductance values of one or more inductors that are connected to the parallel arm resonators to be a predetermined inductance value. In the case of the band pass filter 20A according to the example, the sum of the inductance values of the three inductors 21 to 23 is the predetermined inductance value, and the inductance values of the inductors 21 and 22 that are connected and near to the common terminal 300 are decreased to increase the reflection coefficient in the attenuation band (about 3.3 GHz to about 4.2 GHz). In this way, the impedance of the band pass filter 20A itself in the attenuation band (about 3.3 GHz to about 4.2 GHz) when viewed from the common terminal 300 is able to be effectively increased.

The inductance values of the inductors 21 and 22 that are nearest and second-nearest to the common terminal 300 among the three inductors 21 to 23 of the extractor 1A according to the example may be smaller than the inductance value of the other inductor 23 ($L_{21}<L_{23}$ and $L_{22}<L_{23}$), and the inductance value of the inductor 21 that is nearest to the common terminal 300 may be smaller than inductance value of the inductor 22 that is second-nearest to the common terminal 300 ($L_{21}<L_{22}$).

In this case, since the inductance value of the inductor 21, which is most conducive to improvement in the reflection coefficient of the band pass filter 20A itself in the frequency band higher than the stop band when viewed from the common terminal 300, is smaller than the inductance value of the inductor 22, the insertion loss of the band elimination filter 10A in the frequency band higher than the stop band is able to be further reduced.

Figure 7:
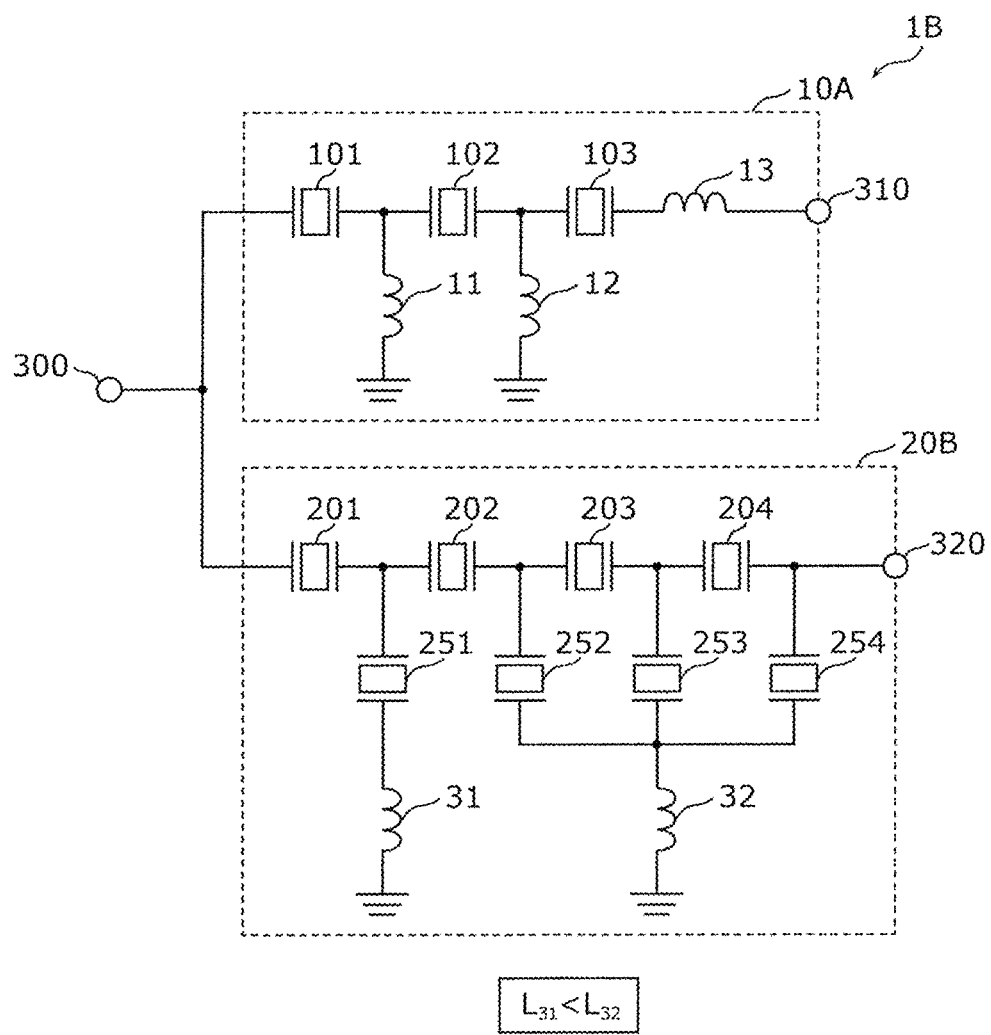
FIG. 7 is a circuit diagram of an extractor according to a first modification of a preferred embodiment of the present invention.

FIG. 7 is a circuit diagram of an extractor 1B according to a first modification of a preferred embodiment of the present invention. As illustrated in FIG. 7, the extractor 1B according to the present modification preferably includes the common terminal 300, the input-output terminals 310 and 320, the band elimination filter 10A, and a band pass filter 20B. The extractor 1B according to the present modification differs from the extractor 1A according to the example in the structure of the band pass filter 20B. In the following description of the extractor 1B according to the present modification, a description of the same or substantially the same structure as the extractor 1A according to the example is omitted, and a different structure will be mainly described.

The band pass filter 20B is a specific example of the band pass filter 20 according to a preferred embodiment and preferably includes the series arm resonators 201, 202, 203, and 204, the parallel arm resonators 251, 252, 253, and 254, and inductors 31 and 32.

The series arm resonators 201 to 204 preferably have the same or substantially the same structure as the series arm resonators 201 to 204 according to the example.

The parallel arm resonators 251 to 254 preferably have the same or substantially the same structure as the parallel arm resonators 251 to 254 according to the example.

The inductor 31 is disposed on a parallel arm that connects the ground and the parallel arm resonator 251 to each other. The inductor 32 is disposed on a parallel arm that connects the ground and a connection node of the parallel arm resonators 252, 253, and 254.

Table 2 illustrates the inductance value of each inductor and the electrode parameters of the band pass filter 20B of the extractor 1B according to the first modification.

TABLE 2

| BANDPASS FILTER 20B (FIRST MODIFICATION) | SERIES ARM RESONATOR 201 | SERIES ARM RESONATOR 202 | SERIES ARM RESONATOR 203 | SERIES ARM RESONATOR 204 |
| --- | --- | --- | --- | --- |
| NUMBER OF PAIRS OF INTERDIGITAL TRANSDUCER ELECTRODE FINGERS(PAIR) | 59 | 196 | 95 | 117 |
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.43 | 2.43 | 2.42 | 2.45 |
|  | PARALLEL ARM RESONATOR 251 | PARALLEL ARM RESONATOR 252 | PARALLEL ARM RESONATOR 253 | PARALLEL ARM RESONATOR 254 |
| NUMBER OF PAIRS OF INTERDIGITAL TRANSDUCER ELECTRODE FINGERS(PAIR) | 50 | 152 | 128 | 112 |
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.53 | 2.54 | 2.56 | 2.54 |
|  | INDUCTOR 31 | | INDUCTOR 32 | |
| INDUCTANCE VALUE (nH) | 0.1 | | 1.2 | |

The band pass filter 20B with the above structure enables achievement of a ladder acoustic wave filter that has a low-loss pass band and steepness of the transition band from the pass band to the attenuation band because the series arm resonators 201 to 204 that include the respective acoustic wave resonators are disposed on a series arm path, and the parallel arm resonators 251 to 254 that include the respective acoustic wave resonators are disposed on different parallel arm paths. In addition, the attenuation and frequency of the attenuation pole in the attenuation band is able to be adjusted and optimized because the inductors 31 and 32 are disposed on the parallel arm paths.

The number of the series arm resonators of the band pass filter 20B is not limited to four and may be one or more, for example. The number of the parallel arm resonators is not limited to four and may be two or more, for example. The number of the inductors that are disposed between the ground and the parallel arm resonators is not limited to two and may be two or more, for example.

Each of the acoustic wave resonators that are included in the band pass filter 20B may preferably be a surface acoustic wave resonator or an acoustic wave resonator that uses a BAW. The surface acoustic wave includes, for example, a surface wave, a Love wave, a Leaky wave, a Rayleigh wave, a boundary wave, a leaky SAW, a pseudo SAW, and a Lamb wave.

This enables the band pass filter 20B to have a lower loss and higher steepness.

The inductance value $L_{31}$ of the inductor 31 (first inductor) that is connected and nearer to the common terminal 300 than the inductor 32 of the two inductors 31 and 32 of the band pass filter 20B is preferably smaller than the inductance value $L_{32}$ of the inductor 32 (fourth inductor) that is connected and more distant to the common terminal 300 than the inductor 31 of the inductors 31 and 32.

When the band pass filter 20B includes three or more inductors that are disposed between the ground and the parallel arm resonators, the inductance value of the first inductor that is connected and nearest to the common terminal 300 among the three or more inductors is preferably smaller than the inductance value of the fourth inductor that has the smallest inductance value among the inductors other than the first inductor.

With the above structure, the inductance value of the inductor 31 that is nearer to the common terminal 300 than the inductor 32 of the two inductors 31 and 32 that are connected to the parallel arms of the band pass filter 20B is preferably smaller than the inductance value of the inductor 32. Accordingly, the impedance of the band pass filter 20B itself in the frequency band higher than the stop band of the band elimination filter 10A when viewed from the common terminal 300 is closer to that in the open state (high impedance) than the impedance of the existing band pass filter itself in the frequency band higher than the stop band. In other words, the reflection coefficient of the band pass filter 20B according to the present modification itself in the frequency band higher than the stop band is larger than the reflection coefficient of the existing band pass filter itself in the above band. Accordingly, the extractor 1B that includes the band elimination filter 10A the insertion loss of which is reduced is able to be provided.

In the extractor 1B according to the first modification, the inductor 31 of the band pass filter 20B is connected between the ground and the parallel arm resonator 251 that is connected and nearest to the common terminal 300 among the two or more parallel arm resonators 251 to 254. The inductor 32 is connected to the ground and a connection node of the parallel arm resonator 252 that is connected and second-nearest to the common terminal 300, the parallel arm resonator 253 that is connected and third-nearest to the common terminal 300, and the parallel arm resonator 254 that is connected and fourth-nearest to the common terminal 300, among the two or more parallel arm resonators 251 to 254.

In some cases, in the band pass filter 20B, which is a ladder acoustic wave filter, the inductor 32 is connected in common to the parallel arm resonators 252 to 254 to adjust the attenuation pole. Also, in these cases, the insertion loss of the band elimination filter 10A in the frequency band higher than the stop band is able to be reduced.

The inductor 32 may not be connected to the parallel arm resonator 254 that is connected and fourth-nearest to the common terminal 300.

Figure 8:
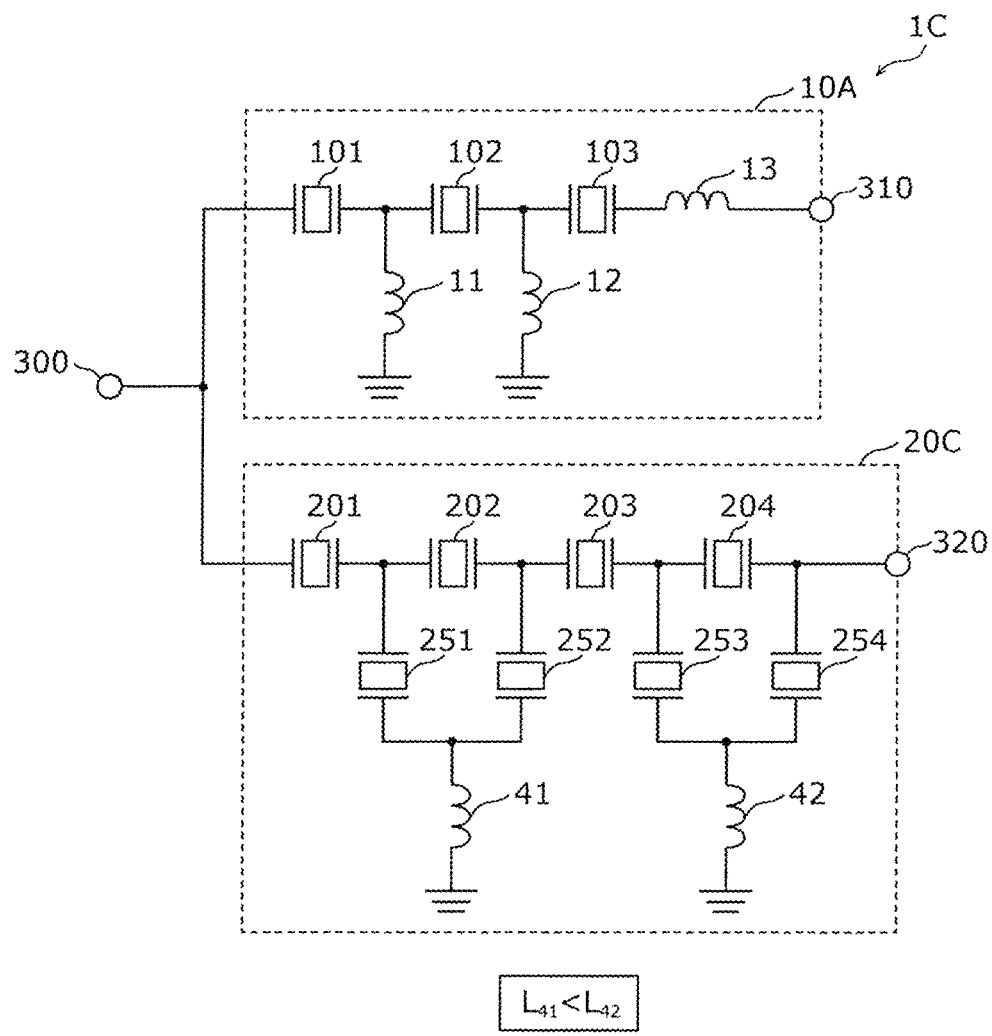
FIG. 8 is a circuit diagram of an extractor according to a second modification of a preferred embodiment of the present invention.

FIG. 8 is a circuit diagram of an extractor 1C according to a second modification of a preferred embodiment of the present invention. As illustrated in FIG. 8, the extractor 1C according to the present modification preferably includes the common terminal 300, the input-output terminals 310 and 320, the band elimination filter 10A, and a band pass filter 20C. The extractor 1C according to the present modification differs from the extractor 1A according to the example in the structure of the band pass filter 20C. In the following description of the extractor 1C according to the present modification, a description of the same or substantially the same structure as the extractor 1A according to the example is omitted, and a different structure will be mainly described.

The band pass filter 20C is a specific example of the band pass filter 20 according to a preferred embodiment and includes the series arm resonators 201, 202, 203, and 204, the parallel arm resonators 251, 252, 253, and 254, and inductors 41 and 42.

The series arm resonators 201 to 204 preferably have the same or substantially the same structure as the series arm resonators 201 to 204 according to the example.

The parallel arm resonators 251 to 254 preferably have the same or substantially the same structure as the parallel arm resonators 251 to 254 according to the example.

The inductor 41 is disposed on a parallel arm that connects the ground and a connection node of the parallel arm resonators 251 and 252 to each other. The inductor 42 is disposed on a parallel arm that connects the ground and a connection node of the parallel arm resonators 253 and 254 to each other. Table 3 illustrates the inductance value of each inductor and the electrode parameters of the band pass filter 20C of the extractor 1C according to the second modification.

TABLE 3

| BAND PASS FILTER 20C (SECOND MODIFICATION) | SERIES ARM RESONATOR 201 | SERIES ARM RESONATOR 202 | SERIES ARM RESONATOR 203 | SERIES ARM RESONATOR 204 |
|---|---|---|---|---|
| NUMBER OF PAIRS OF INTERDIGITAL TRANSDUCER ELECTRODE FINGERS(PAIR) | 59 | 196 | 95 | 117 |
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.43 | 2.43 | 2.42 | 2.45 |
|  | PARALLEL ARM RESONATOR 251 | PARALLEL ARM RESONATOR 252 | PARALLEL ARM RESONATOR 253 | PARALLEL ARM RESONATOR 254 |
| NUMBER OF PAIRS OF INTERDIGITAL TRANSDUCER ELECTRODE FINGERS(PAIR) | 50 | 152 | 128 | 112 |
| CROSSING WIDTH (μm) | 30 | 30 | 30 | 30 |
| ELECTRODE DUTY | 0.60 | 0.60 | 0.60 | 0.60 |
| INTERDIGITAL TRANSDUCER WAVE LENGTH (μm) | 2.53 | 2.54 | 2.56 | 2.54 |
|  | INDUCTOR 41 |  | INDUCTOR 42 |  |
| INDUCTANCE VALUE (nH) | 0.1 |  | 1.2 |  |

The band pass filter 20C with the above structure enables achievement of a ladder acoustic wave filter that has a low-loss pass band and steepness of the transition band from the pass band to the attenuation band because the series arm resonators 201 to 204 that include the respective acoustic wave resonators are disposed on a series arm path, and the parallel arm resonators 251 to 254 that include the respective acoustic wave resonators are disposed on different parallel arm paths. In addition, the attenuation and frequency of the attenuation pole in the attenuation band is able to be adjusted and optimized because the inductors 41 and 42 are disposed on the parallel arm paths.

The number of the series arm resonators of the band pass filter 20C is not limited to four and may be one or more, for example. The number of the parallel arm resonators is not limited to four and may be two or more, for example. The number of the inductors that are disposed between the ground and the parallel arm resonators is not limited to two and may be two or more, for example.

Each of the acoustic wave resonators that are included in the band pass filter 20C may preferably be a surface acoustic wave resonator or an acoustic wave resonator that uses a BAW, for example. The surface acoustic wave includes, for example, a surface wave, a Love wave, a Leaky wave, a Rayleigh wave, a boundary wave, a leaky SAW, a pseudo SAW, and a Lamb wave.

This enables the band pass filter 20C to have a lower loss and higher steepness.

The inductance value $L_{41}$ of the inductor 41 (first inductor) that is connected and nearer to the common terminal 300 than the inductor 42 of the two inductors 41 and 42 of the band pass filter 20C is preferably smaller than the inductance value $L_{42}$ of the inductor 42 (fourth inductor) that is connected and more distant to the common terminal 300 than the inductor 41 of the inductors 41 and 42.

When the band pass filter 20C includes three or more inductors that are disposed between the ground and the parallel arm resonators, the inductance value of the first inductor that is connected and nearest to the common terminal 300 among the three or more inductors is preferably smaller than the inductance value of the fourth inductor that has the smallest inductance value among the inductors other than the first inductor.

With the above structure, the inductance value of the inductor 41 that is nearer to the common terminal 300 than the inductor 42 of the two inductors 41 and 42 that are connected to the parallel arms of the band pass filter 20C is preferably smaller than the inductance value of the inductor 42. Accordingly, the impedance of the band pass filter 20C itself in the frequency band higher than the stop band of the band elimination filter 10A when viewed from the common terminal 300 is closer to that in the open state than the impedance of the existing band pass filter itself in the frequency band higher than the stop band. In other words, the reflection coefficient of the band pass filter 20C according to the present modification itself in the frequency band higher than the stop band is preferably larger than the reflection coefficient of the existing band pass filter itself in the above band. Accordingly, the extractor 1C that includes the band elimination filter 10A the insertion loss of which is reduced is able to be provided.

In the extractor 1C according to the second modification, the inductor 41 of the band pass filter 20C is connected between the ground and a connection node of the parallel arm resonator 251 that is connected and nearest to the common terminal 300 among the two or more parallel arm resonators 251 to 254 and the parallel arm resonator 252 that is connected and second-nearest to the common terminal 300 among the two or more parallel arm resonators 251 to 254. The inductor 42 is connected to the ground and a connection node of the parallel arm resonator 253 that is connected and third-nearest to the common terminal 300 and the parallel arm resonator 254 that is connected and fourth-nearest to the common terminal 300.

In some cases, in the band pass filter 20C, which is a ladder acoustic wave filter, the inductor 41 is connected in common to the parallel arm resonators 251 and 252, and the inductor 42 is connected in common to the parallel arm resonator 253 and 254 to adjust the attenuation pole. Also, in these cases, the insertion loss of the band elimination filter 10A in the frequency band higher than the stop band is able to be reduced.

The inductor 42 may not be connected to the parallel arm resonator 254 that is connected and fourth-nearest to the common terminal 300.

Figure 9:
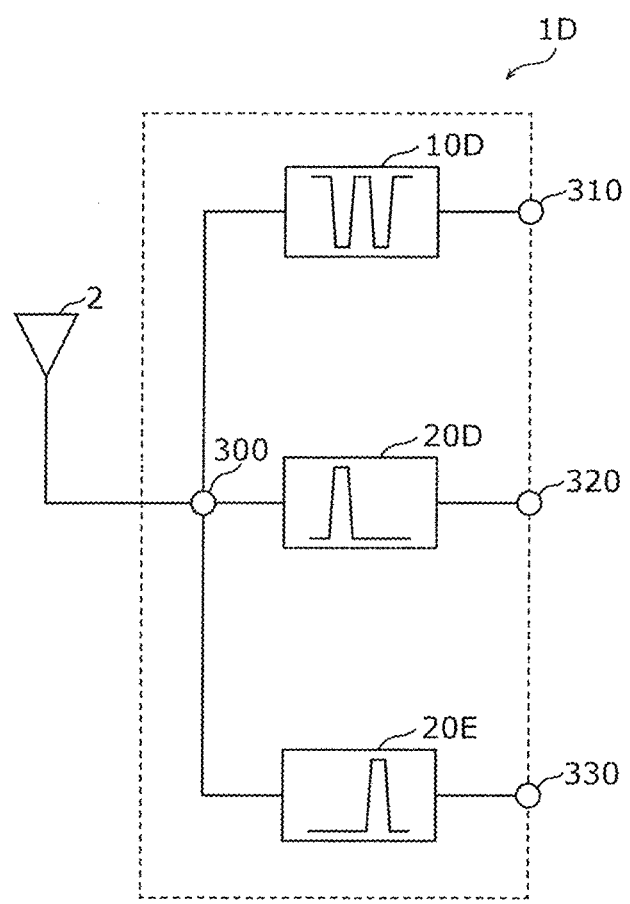
FIG. 9 is a block diagram of an extractor and an antenna according to a third modification of a preferred embodiment of the present invention.

FIG. 9 is a block diagram of an extractor 1D and the antenna 2 according to a third modification of a preferred embodiment of the present invention. As illustrated in FIG. 9, the extractor 1D preferably includes the common terminal 300, the input-output terminals 310 and 320, an input-output terminal 330, a band elimination filter 10D, and band pass filters 20D and 20E. The extractor 1D according to the present modification differs from the extractor 1 according to the preferred embodiment in including the band elimination filter 10D that has a stop band that contains two bands and the two band pass filters 20D and 20E that have different pass bands. In the following description of the extractor 1D according to the present modification, a description of the same or substantially the same structure as the extractor 1 according to the preferred embodiment is omitted, and a different structure will be mainly described.

The band elimination filter 10D is connected between the common terminal 300 and the input-output terminal 310 (first input-output terminal) and has a stop band that contains the first frequency band and a third frequency band that does not overlap the first frequency band.

The band pass filter 20D is a first band pass filter that is connected between the common terminal 300 and the input-output terminal 320 (second input-output terminal) and has a pass band equal or substantially equal to the second frequency band that overlaps at least a portion of the first frequency band.

The band pass filter 20E is a second band pass filter that is connected between the common terminal 300 and the input-output terminal 330 (third input-output terminal) and has a pass band equal or substantially equal to a fourth frequency band that overlaps at least a portion of the third frequency band.

The extractor 1D is connected to the antenna 2 by using the common terminal 300.

At least one of the band pass filters 20D and 20E of the extractor 1D has the following structure.

The band pass filter 20D is disposed on a series arm that connects the common terminal 300 and the input-output terminal 320 to each other and includes series arm resonators that include respective acoustic wave resonators. Three or more parallel arm resonators that include respective acoustic wave resonators are disposed on parallel arms that connect the ground and different nodes on the series arm. Three or more inductors are connected between the ground and at least one of the three or more parallel arm resonators. The inductance value of the first inductor that is connected and nearest to the common terminal 300 among the three or more inductors is smaller than the inductance value of the third inductor that has the smallest inductance value among the inductors that are connected and third-nearest or more distant to the common terminal 300 in the three or more inductors. The inductance value of the second inductor that is connected and second-nearest to the common terminal 300 among the three or more inductors is smaller than the inductance value of the third inductor.

The band pass filter 20E is disposed on a series arm that connects the common terminal 300 and the input-output terminal 330 to each other and includes series arm resonators that include respective acoustic wave resonators. Three or more parallel arm resonators that include respective acoustic wave resonators are disposed on parallel arms that connect the ground and different nodes on the series arm. Three or more inductors are preferably connected between the ground and at least one of the three or more parallel arm resonators. The inductance value of the first inductor that is connected and nearest to the common terminal 300 among the three or more inductors is preferably smaller than the inductance value of the third inductor that has the smallest inductance value among the inductors that are connected and third-nearest or more distant to the common terminal 300 in the three or more inductors. The inductance value of the second inductor that is connected and second-nearest to the common terminal 300 among the three or more inductors is preferably smaller than the inductance value of the third inductor.

In the extractor 1D, which includes the two band pass filters 20D and 20E that have the respective pass bands of two different frequency bands and the band elimination filter 10D that has the stop band that includes the two different frequency bands, the inductance value of the first inductor near the common terminal 300 among the inductors that are connected to parallel arm paths of at least one of the band pass filters is preferably smaller than the inductance values of the inductors that are at least third-nearest or more distant thereto. Accordingly, the impedance of each band pass filter itself in the frequency band higher than the stop band when viewed from the common terminal 300 is closer to that in the open state than the impedance of the existing band pass filter itself in the frequency band higher than the stop band. In the existing band pass filter, the inductance value of the first inductor is not smaller than the inductance values of the inductors that are at least third-nearest or more distant thereto. In other words, the reflection coefficient of each band pass filter with the structure according to the present modification itself is larger than the reflection coefficient of the existing band pass filter itself in the above band. Accordingly, the insertion loss of the band elimination filter 10D in the frequency band higher than at least one of the bands contained in the stop band is able to be reduced.

At least one of the band pass filters 20D and 20E of the extractor 1D may have the following structure instead of the above structure.

The band pass filter 20D is preferably disposed on the series arm that connects the common terminal 300 and the input-output terminal 320 to each other and includes one or more series arm resonators that include respective acoustic wave resonators. Two or more parallel arm resonators that include respective acoustic wave resonators are disposed on parallel arms that connect the ground and different nodes on the series arm. Two or more inductors are connected between the ground and at least one of the two or more parallel arm resonators. The inductance value of the first inductor that is connected and nearest to the common terminal 300 among the two or more inductors is smaller than the inductance value of the fourth inductor that has the smallest inductance value among the inductors other than the first inductor.

The band pass filter 20E is preferably disposed on the series arm that connects the common terminal 300 and the input-output terminal 330 to each other and includes one or more series arm resonators that include respective acoustic wave resonators. Two or more parallel arm resonators that include respective acoustic wave resonators are disposed on parallel arms that connect the ground and different nodes on the series arm. Two or more inductors are connected between the ground and at least one of the two or more parallel arm resonators. The inductance value of the first inductor that is connected and nearest to the common terminal 300 among the two or more inductors is smaller than the inductance value of the fourth inductor that has the smallest inductance value among the inductors other than the first inductor.

Also, with the above structure, the insertion loss of the band elimination filter 10D in the frequency band higher than at least one of the bands contained in the stop band is able to be reduced.

The extractors according to preferred embodiments of the present invention, the example embodiment, and the modifications of preferred embodiments of the present invention are described above. The present invention, however, is not limited to the preferred embodiment, the example, and the modifications described above. For example, a modification to the above preferred embodiment is also included in the present invention.

For example, according to the preferred embodiments and the modifications thereto, the GPS (registered trademark) band is described as an example of the stop band of the band elimination filter and the pass band of the band pass filter. However, the stop band and the pass band may be a Wi-Fi (registered trademark) band (a band of about 2.4 GHz or about 5 GHz), or Band32 (a pass band of about 1452 MHz to about 1496 MHz) of a LTE (Long Term Evolution), for example.

According to the preferred embodiments and the modifications thereto, n77 of 5GNR is described as an example of the attenuation band higher than the pass band and the stop band. However, a communication band of the other 5GNR or a communication band of 4G (LTE) may also be acceptable.

Each extractor described above may include another band pass filter in the input-output terminal opposite the common terminal. The extractor may include, for example, a PA (power amplifier) and a LNA (low noise amplifier) in any one of the input-output terminals opposite the common terminal.

Preferred embodiments of the present invention may be widely used for communication devices such as cellular phones, for example, that use, for example, a receiver, a transmitter, and a front-end circuit that includes the extractor that enables communications in different radio frequency bands with different wireless systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An extractor, comprising:
   a common terminal;
   a first input-output terminal;
   a second input-output terminal;
   a band elimination filter connected between the common terminal and the first input-output terminal and that has a stop band equal or substantially equal to a first frequency band; and
   a first band pass filter connected between the common terminal and the second input-output terminal and that has a pass band equal or substantially equal to a second frequency band that overlaps at least a portion of the first frequency band; wherein the first band pass filter includes:
   series arm resonators that include an acoustic wave resonator and that are disposed on a series arm that connects the common terminal and the second input-output terminal to each other;
   three or more parallel arm resonators that include an acoustic wave resonator and that are disposed on parallel arms that connect a ground and different nodes on the series arm to each other; and
   three or more inductors that are connected between the ground and at least one of the three or more parallel arm resonators;
   an inductance value of a first inductor that is connected nearest to the common terminal among the three or more inductors is smaller than an inductance value of a third inductor among the three or more inductors and an inductance value of a second inductor that is connected second-nearest to the common terminal among the three or more inductors is smaller than the inductance value of the third inductor; and
   when the three or more inductors includes four or more inductors, the inductance value of the third inductor is a smallest inductance value among inductors that are connected third-nearest or more distant to the common terminal among the four or more inductors.

2. The extractor according to claim 1, wherein the inductance value of the first inductor is smaller than the inductance value of the second inductor.

3. An extractor, comprising:
   a common terminal;
   a first input-output terminal;
   a second input-output terminal;
   a band elimination filter connected between the common terminal and the first input-output terminal and that has a stop band equal or substantially equal to a first frequency band; and
   a first band pass filter connected between the common terminal and the second input-output terminal and that has a pass band equal or substantially equal to a second frequency band that overlaps at least a portion of the first frequency band; wherein the first band pass filter includes:
   one or more series arm resonators that include an acoustic wave resonator and that are disposed on a series arm that connects the common terminal and the second input-output terminal to each other;
   two or more parallel arm resonators that include an acoustic wave resonator and that are disposed on parallel arms that connect a ground and different nodes on the series arm to each other, and two or more inductors that are connected between the ground and at least one of the two or more parallel arm resonators; and
   an inductance value of a first inductor that is connected and nearest to the common terminal among the two or more inductors is smaller than an inductance value of a fourth inductor that has a smallest inductance value among inductors other than the first inductor.

4. The extractor according to claim 3, wherein
   the first inductor is connected between the ground and a parallel arm resonator that is connected nearest to the common terminal among the two or more parallel arm resonators; and
   the fourth inductor is connected between the ground and a connection node of a parallel arm resonator that is connected second-nearest to the common terminal and a parallel arm resonator that is connected third-nearest to the common terminal among the two or more parallel arm resonators.

5. The extractor according to claim 3, wherein
   the first inductor is connected between the ground and a connection node of a parallel arm resonator that is connected nearest to the common terminal and a parallel arm resonator that is connected second-nearest to the common terminal among the two or more parallel arm resonators; and
   the fourth inductor is connected between the ground and a parallel arm resonator that is connected third-nearest to the common terminal among the two or more parallel arm resonators.

6. The extractor according to claim 1, wherein
   the stop band of the band elimination filter includes the first frequency band and a third frequency band that does not overlap the first frequency band; and
   the extractor further includes:
   a third input-output terminal; and
   a second band pass filter that is connected between the common terminal and the third input-output terminal and that has a pass band equal or substantially equal to a fourth frequency band that overlaps at least a portion of the third frequency band.

7. The extractor according to claim 1, wherein the band elimination filter includes a series arm resonator that is disposed on a series arm that connects the common terminal and the first input-output terminal to each other and that includes an acoustic wave resonator, and an inductor that is disposed on a parallel arm that connects the ground and a node on the series arm to each other.

8. The extractor according to claim 1, wherein the acoustic wave resonator is a surface acoustic wave resonator or an acoustic wave resonator that uses a Bulk Acoustic Wave.

9. The extractor according to claim 1, wherein the band elimination filter and the first band pass filter are connected to an antenna with the common terminal interposed therebetween.

10. The extractor according to claim 1, wherein the band elimination filter includes band eliminate series arm resonators and band eliminate inductors.

11. The extractor according to claim 10, wherein
    the band eliminate series arm resonators are disposed on a band elimination series arm that connects the common terminal and the first input-output terminal; and
    the band elimination inductors include:
    a series inductor that is disposed in series between the band elimination series arm resonators and the first input-output terminal; and
    parallel inductors that are disposed on parallel arms that connect the ground to nodes on the band elimination series arm.

12. The extractor according to claim 1, wherein two acoustic wave resonators of the three or more parallel arm resonators are directly connected to a same one of the three or more inductors.

13. The extractor according to claim 1, wherein the acoustic wave resonators of the series arm resonators and the parallel arm resonators include a pair of comb electrodes that face each other on a piezoelectric substrate.

14. The extractor according to claim 13, wherein the pair of comb electrodes are defined by a multi-layer structure including a close-contact layer and a main electrode layer.

15. The extractor according to claim 14, wherein the pair of comb electrodes are covered by a dielectric protective layer that protects the main electrode layer from an external environment.

16. The extractor according to claim 13, wherein the piezoelectric substrate includes a high acoustic velocity support substrate, a low acoustic velocity film, and a piezoelectric film.

17. The extractor according to claim 13, wherein the piezoelectric substrate is a single layer substrate defined by a single-crystal piezoelectric substrate.

18. The extractor according to claim 3, wherein
the two or more parallel arm resonators include at least three acoustic wave resonators; and
three of the at least three acoustic wave resonators are each directly connected to one of the two or more inductors.

19. The extractor according to claim 3, wherein
the two or more parallel arm resonators include at least four parallel arm resonators;
a first pair of the at least four parallel arm resonators are each directly connected to a first one of the two or more inductors; and
a second pair of the at least four parallel arm resonators are each directly connected to a second one of the two or more inductors.

20. The extractor according to claim 6, wherein the band elimination filter, the first band pass filter, and the second band pass filter are connected to an antenna with the common terminal interposed therebetween.

* * * * *